United States Patent [19]

Shigemoto et al.

[11] Patent Number: 4,880,589
[45] Date of Patent: Nov. 14, 1989

[54] PROCESS OF MAKING A NON-ORIENTED, SURFACE-ROUGHENED FILM OR SHEET

[75] Inventors: Hiromi Shigemoto, Iwakuni; Shunji Abe, Tokyo; Akio Yamamoto, Iwakuni, all of Japan

[73] Assignee: Mitsui Petrochemical Industries, Ltd., Tokyo, Japan

[21] Appl. No.: 219,757

[22] Filed: Jun. 21, 1988

Related U.S. Application Data

[62] Division of Ser. No. 892,043, Aug. 1, 1986, Pat. No. 4,777,201.

[30] Foreign Application Priority Data

Aug. 2, 1985 [JP] Japan ................. 60-170875

[51] Int. Cl.[4] ............ B29C 43/20; B29C 59/04; B32B 31/22
[52] U.S. Cl. ................. 264/216; 156/219; 264/257; 264/258; 264/284; 264/293
[58] Field of Search .......... 264/162, 211.12, 216, 264/257, 258, 284, 293; 156/219, 220

[56] References Cited

U.S. PATENT DOCUMENTS

| | | | |
|---|---|---|---|
| 3,415,796 | 12/1968 | Souder et al. | 428/141 |
| 3,540,959 | 11/1970 | Connor | 156/219 X |
| 3,729,530 | 4/1973 | Curry | 264/293 X |
| 3,884,771 | 5/1975 | Hanabusa et al. | 264/293 X |
| 4,146,591 | 3/1979 | Fukui et al. | 525/268 |
| 4,288,584 | 9/1981 | Mishra | 526/348.4 |
| 4,357,448 | 9/1982 | Tsubaki et al. | 526/65 |
| 4,486,377 | 12/1984 | Lucchesi et al. | 264/216 X |
| 4,546,150 | 10/1985 | Shigemoto | 525/240 |

FOREIGN PATENT DOCUMENTS

| | | | |
|---|---|---|---|
| 47-28106 | 7/1972 | Japan | 156/220 |
| 52-34664 | 9/1977 | Japan . | |
| 52-49823 | 12/1977 | Japan . | |
| 56-28812 | 3/1981 | Japan | 264/284 |
| 56-78939 | 6/1981 | Japan | 264/293 |
| 57-70653 | 5/1982 | Japan . | |
| 57-70654 | 5/1982 | Japan . | |
| 58-163648 | 9/1983 | Japan . | |
| 59-62113 | 4/1984 | Japan | 264/258 |
| 61-181632 | 8/1986 | Japan | 264/258 |

*Primary Examiner*—Jeffery Thurlow
*Assistant Examiner*—Leo B. Tentoni
*Attorney, Agent, or Firm*—Cushman, Darby & Cushman

[57] ABSTRACT

A process for production of an essentially non-oriented surface-roughened film or sheet comprising a crystalline homopolymer or crystalline copolymer of 4-methyl-1-pentene having a surface roughness of 0.5 to 10 micrometers, said process including the following steps (1) preparing a molten composition comprising a homopolymer or copolymer of 4-methyl-1-pentene, (2) extruding the molten composition to form a film or sheet, and (3) placing the film or sheet in contact with a roller having a roughened surface or passing the film or sheet through a pair of rollers, at least one of which has a roughened surface; and the use of the above-mentioned surface roughened film or sheet for the manufacture of single-sided metal clad laminates.

5 Claims, 4 Drawing Sheets

PROCESS OF MAKING A NON-ORIENTED, SURFACE-ROUGHENED FILM OR SHEET

This is a division of application Ser. No. 892,043, filed Aug. 1, 1986, now U.S. Pat. No. 4,777,201.

BACKGROUND OF THE INVENTION

1. Field of the Invention

The present invention relates to a novel surface-roughened film and sheet comprising a polymer of 4-methyl-1-pentene, and a process for the production and use thereof.

2. Description of the Related Art

The essentially non-oriented surface-roughened film and sheet of the present invention is especially useful for the production of multilayer printed circuit boards, which are increasingly used in various kinds of electric apparatus. Usually, in a manufacturing process for multilayer printed circuit boards, first, single-sided metal-clad laminates or double-sided metal-clad laminates are produced and then an electric circuit is printed on those laminates, and the printed circuits are stacked via prepregs and pressed with heating to form the multilayer printed circuit boards. To strengthen the adhesion between the resin side of the single-sided metal-clad laminates and the prepregs, the surface of the resin side of the single-sided metal-clad laminate is preferably surface-roughened.

The above-mentioned single-sided or double-sided metal-clad laminate is manufactured by stacking a metal foil and a prepreg, and pressing them with heating to harden the prepreg. In such procedure, to surface-roughen the surface of the resin side of the laminate, a surface-roughened film or sheet is applied to a surface of the prepreg during the hardening process.

The surface-roughened film and sheet according to the present invention is useful as the above-mentioned surface-roughened film to roughen the surface of the resin side of the single-sided metal-clad laminate.

Japanese Examined Patent Publication No. 52-34664 discloses a process for the production of a biaxially oriented film having frosted surfaces comprising methyl-pentene polymer, which process comprises biaxially orienting a film comprising methylpentene polymer, high-density polyethylene and polystyrene, and heat-hardening the resulting film to form a frosted film. However the publication does not disclose the use of the film having frosted surfaces to surface-roughen the surface of the resin side of a laminate.

Japanese Examined Patent Publication No. 52-49823 discloses a process for the production of a laminate by an additive process characterized by placing a releasing film having a surface roughness of 0.5 to 5μ on a prepreg impregnated with a thermoset resin, and forming it with heating. However the publication discloses only a triacetate film for the releasing film.

Japanese Unexamined Patent Publications No. 57-70653, No. 58-163648, and No. 57-70654 describe the use of 4-methylpentene-1 sheet as a releasing film in the manufacture of a laminate from a prepreg and metal foil. But these publications do not disclose the use of a surface-roughened film as a releasing film.

As a film providing roughness to the above-mentioned multilayer circuit board, TEDLAR (Trade mark of Du Pont, USA) a biaxially oriented film of polyvinyl fluoride containing a substantial amount of low molecular fillers and 5% calcium carbonate is commercially available. Since, however, this film is produced by biaxial orientation, the surface thereof has deposits of the low molecular materials and calcium carbonate thereon. Therefore, when this film is used to produce single-sided metal clad-laminates by alternately stacking the copper foil and a prepreg, and the TEDLAR film between the layers of the copper foil and the prepreg, and pressing them with heating to harden the prepregs, the low molecular materials and the calcium carbonate may be transferred to the surface of the laminated copper foil, resulting in unsatisfactory adhesion between the copper surface and a resist, and unsatisfactory etching during further processing of the multilayer circuit boards.

Triacetylcellulose films having a surface roughened by sandblasting have been used. But, in this case, the fine sand and cellulose cause the same problems as mentioned above for TEDLAR.

SUMMARY OF THE INVENTION

The present invention provides a essentially non-oriented surface-roughened film or sheet comprising a homopolymer or copolymer of 4-methyl-1-pentene having a surface roughness of 0.5 to 10 micrometers.

There is also provided a process for the production of the above-mentioned surface-roughened film or sheet comprising the following steps:

(1) preparing a molten composition comprising a homopolymer or copolymer of 4-methyl-1-pentene;

(2) extruding the molten composition to form a film or sheet; and (3) placing the film or sheet in contact with a roll having a roughened surface or passing the film or sheet through a pair of rolles, at least one of the rollers having a roughened surface, wherein the surface roughness of the surface of the roller is 0.5 to 10 micrometers, at a pressure and a temperature sufficient to replicate the roughness of the surface of the roll onto the surface of the film or sheet.

There is also provided a process for production of the above-mentioned surface roughened film or sheet comprising the following steps:

(1) preparing a molten composition comprising a homopolymer or copolymer of 4-methyl-1-pentene;

(2) extruding the molten composition and (3) placing the molten composition in contact with a roll having a roughened surface or passing the molten composition through a pair of rollers, at least one of which rollers has a roughened surface, to form a film or sheet having a having a roughened surface, wherein the surface roughness of the roughened roller is is 0.5 to 10 micrometers at a pressure and a temperature such that the roughness of the surface of the roll is replicated on the surface of the film or sheet.

Another object of the present invention relates to the use of a essentially non-oriented surface-roughened film or sheet for the manufacture of single-sided metal clad laminates wherein the surface-roughened film or sheet is applied to a stack consisting of a prepreg and a metal foil so that the roughened surface of the surface-roughened film or sheet is in contact with a surface of the prepreg at a side opposite to the metal foil, and one or more of the stacks are placed between heated press plates and pressed with heating to harden the prepreg, wherein the roughness of the surface-roughened film or sheet is replicated onto the surface of the hardened prepregs.

DESCRIPTION OF THE PREFERRED EMBODIMENTS

Figure 1:
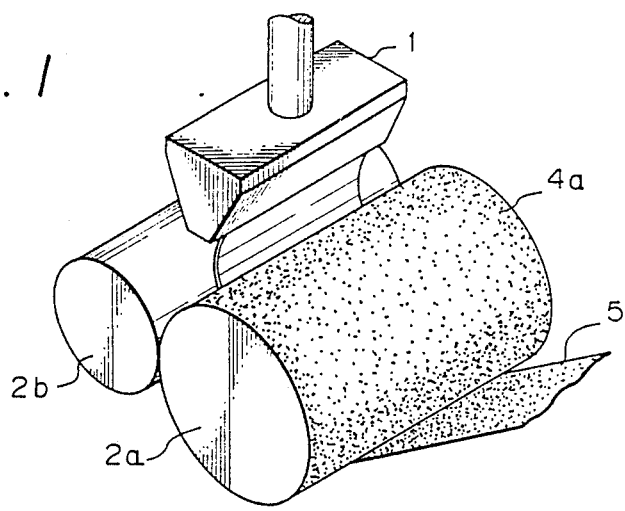
FIG. 1 schematically represents a process for the production of a film or sheet of the present invention.

The film and sheet of the present invention comprises a crystalline homopolymer of 4-methyl-1-pentene, or a crystalline polymer of 4-methyl-1-pentene with one or more of olefins. The polymer should have a high softening point so that it is fully resistant to a temperature at which a prepreg in question is hardened, and should be easily roughened at a temperature lower than a softening temperature of a roughening means. The olefins include α-olefin having 2 to 20 carbon atoms, for example, ethylene, propylene, 1-butene, 1-hexene, 1-octene, 1-decene, 1-tetradecene, 1-hexadecene, and 1-octadecene. The polymers can contain poly4-methyl-1-pentene unit of at least 85 molar percent, preferably 90 to 98 molar percent. The melt flow rate of the poly4-methyl-1-pentene homopolymer or copolymer is preferably 0.5 to 250 g/10 min., more preferably 5 to 120 g/10 min., as measured under the condition of a loading of 5 kg and a temperature of 260° C. The melting viscosity of a polymer having a melt flow rate of less than 0.5 g/10 min. is too high, and results in a poor molding property; and the melting viscosity of a polymer having a melt flow rate of more than 200 g/10 min. is too low, and results in a low mechanical strength and poor molding properties.

The film and sheet may contain additives or fillers. One such additive is a silicone oil, which may improve the releasing property of the film from a hardened prepreg. The silicone oil has, for example, the following general formula:

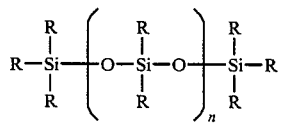

wherein R is same or different, and represents a hydrogen atom, an aromatic hydrocarbon group, or a saturated or unsaturated aliphatic group optionally containing hetero atoms, and n represents a positive integer.

The aromatic hydrocarbon group includes an aromatic hydrocarbon group having 6 to 12 carbon atoms unsubstituted or substituted with lower alkyl groups having 1 to 3 carbon atoms, for example, phenyl, tolyl, ethylphenyl, isopropylphenyl, naphthyl, and biphenyl.

The unsaturated or saturated aliphatic group includes, for example, alkyl groups having 1 to 6 carbon atoms, such as methyl, ethyl, propyl, butyl, pentyl, and hexyl; alkenyl or alkinyl groups having 2 to 6 carbon atoms, such as vinyl, 2-propenyl, propargyl, 3-butenyl, 4-pentenyl, and 5-hexenyl; and cycloaliphatic groups having 5 to 6 carbon atoms, such as cyclopentyl, cyclohexyl, cyclopentenyl, and cyclohexenyl.

The silicone oil preferably has a viscosity of $5 \times 10$ to $8 \times 10^6$ cps, more preferably $5 \times 10^2$ to $5 \times 10^6$ cps, as measured by rotational viscometer at 25° C.

The film or sheet contains the silicone oil preferably in an amount of 0.01 to 6% by weight, more preferably 0.5 to 5% by weight, in relation to the poly4-methyl-1-pentene polymer. The amount of the silicone oil should be limited as above mentioned so that the silicone oil is not transferred from the film or sheet to a surface of a hardened resin, resulting in a lowering of the adhesion strength between the hardened resin board of a single-sided metal-clad laminate and a prepreg when they are assembled.

Moreover, the film and sheet of the present invention can contain fillers, such as calcium carbonate, silica, mica, barium sulfate, talc and the like in an amount which does not lower the tear strength. Such fillers, if any, are used usually in an amount of not more than 43 parts by weight, preferably not more than 20 parts by weight, in relation to the weight of the poly4-methyl-1-pentene polymer. The fillers may provide an improved toughness to the film surface.

Finally, the film and sheet of the present invention can containing a thermostabilizing agent, weathering agent, rust preventive, copper inhibitor, antistatic agent, and the like, depending on the final use of the film or sheet.

The film and sheet of the present invention have a roughened-surface(s) on one or both sides thereof. The roughness is transferred or replicated, for example, to a surface of a resin side of a single-sided metal-clad laminate. The mean surface roughness is 0.5 to 10 micrometers. A mean surface roughness of less than 0.5 micrometers cannot provide a sufficient surface area for improving the adhesion between the hardened resin and a prepreg. On the other hand, a mean surface roughness of more than 10 micrometers will provide a too strong adhesion between the hardened resin and the film of the present invention, resulting in breakage of or partial adhesion to the hardened resin of the film when it is released. The maximum surface roughness is preferably less than 20% of the thickness of the film or sheet.

According to the present invention, the mean surface roughness is represented by a center line mean roughness (Ra) defined by JIS B0601-1970, and is measured, for example, by a Surface Figure Measuring Apparatus (Type SE-3A) provided by K. K. Kosaka Kenkyusho in Japan.

The thickness of the film or sheet of the present invention is usually 5 to 1000 micrometers, and preferably 15~200 micrometers.

The film and sheet of the present invention are produced from a composition comprising a poly4-methyl-1-pentene homo- or copolymer, and optionally, additives and/or fillers.

The composition is molten, for example at 270° C. to 320° C., and extruded from a die.

After that, a surface-roughened film or sheet is produced according to one of two procedures.

According to one procedure, the molten composition is applied to a roll having a roughened surface, so that the film or sheet is formed and simultaneously the film or sheet is surface-roughened. The procedure is schematically shown in FIGS. 1 and 2.

Figure 3:
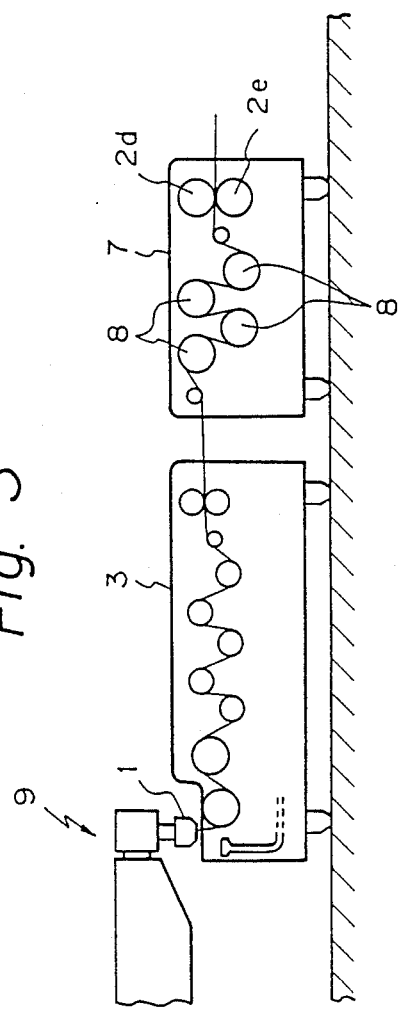
FIG. 3 represents another system for the present process.

According to another procedure, once the composition is extruded to form a film or sheet, and then the film or sheet is surface-roughened. This procedure is schematically shown in FIG. 3.

Figure 2:
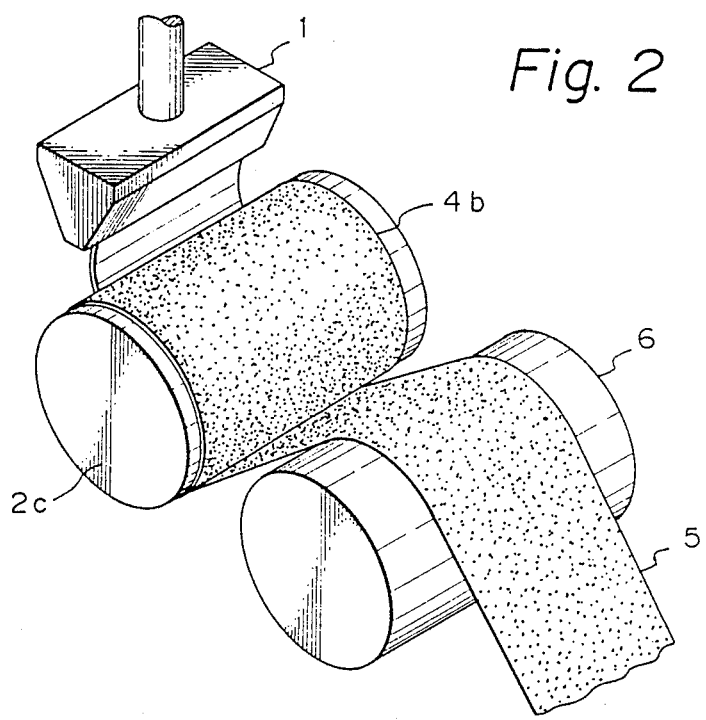
FIG. 2 schematically represents another process for the production of a film or sheet of the present invention.

Referring to FIG. 1, the apparatus used for production of the present film or sheet comprises a T-die 1 and a pair of rolls 2a and 2b adjacent to an extruder outlet of the T-die. At least one of the rolls has a roughened surface 4a with a mean surface roughness of 0.5 to 10 micrometers.

A molten composition is extruded through the T-die in a conventional fashion, and is passed between the rolls having, for example, 40° to 100° C. of temperature at a pressure of 3 to 40 kg/cm$^2$ to form a film or sheet having a roughened surface and the roughened film or sheet 5 is wound by wind-up roll (not shown). Where both the rolls have a roughened surface, a film or sheet roughened on both sides is produced.

Referring to FIG. 2, the apparatus comprises a T-die 1, a roll 2c having a roughened film 4b adhered thereon, and a roll 6. The roughened film 4b has surface roughness of 0.5 to 10 micrometers, and is made from a material having a softening temperature higher than that of the film or sheet 5 of the present invention. The material for the roughened film 4b includes, for example, fluorine plastics such as ethylene tetrafluoride resin, polyvinylidene fluoride etc, polysulfone, and polyvinyl ether ketone, and the like.

Referring to FIG. 3, a combination of a haul-off apparatus 3 and a surface treatment apparatus 7 is used. As seen from FIG. 3, the molten composition is extruded through the T-die 1, the formed film or sheet is cooled in the haul-off apparatus 3, and the film or sheet 3 is then sent from the haul-off apparatus 3 to the surface treatment apparatus 7. The surface treatment apparatus 7 contains heating rolls 8 and a pair of surface roughening rolls 2d and 2e, at least one of which has a roughened surface with a roughness of 0.5 to 10 micrometers. The cooled film or sheet provided from the haul-off apparatus 3 is again heated by the heating rolls 8 to a temperature at which the roughness of the surface roughening rolls 2d and 2e can be replicated onto the heated film or sheet, i.e., to a temperature higher than the softening temperature of the film or sheet, for example 140° to 220° C. Finally the heated film or sheet is passed between the paired roughening rolls 2d and 2e at a pressure of 40 to 100 kg/cm$^2$ to provide the roughness to the film or sheet. If only one of the roughening rolls 2d and 2e has the roughened surface, a film or sheet roughened on only one side is obtained; and if both roughening rolls 2d and 2e have a roughened surface, a film or sheet roughened on both sides is obtained. Alternatively, the surface treating apparatus 7 can contain one roughening roll as shown in FIG. 2 rather than a pair of the roughening rolls.

The roughening roll per se may have a roughened surface as shown in FIG. 1. Alternatively, the roughening roll can comprises a roll without a surface roughness and a roughened film is adhered to the surface of the roll, as shown in FIG. 2. In the latter case, the present process can be economically carried out using any conventional film or sheet forming apparatus, by modifying a roll by adhering a surface roughened film thereon.

The film and sheet of the present invention is especially useful in the manufacture of multilayer printed circuit boards.

Figure 7A:
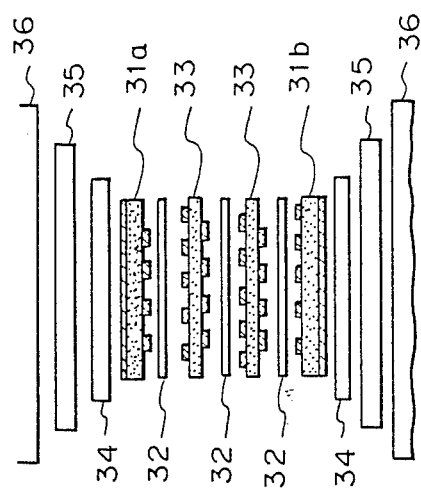
FIG. 7 represents general processes for production of a multilayer printed circuit board.
Figure 7B:
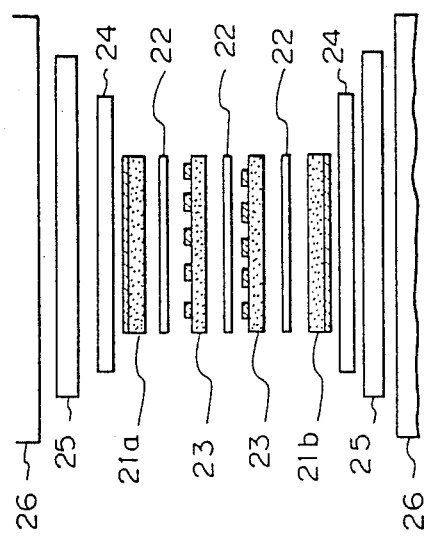

FIG. 7 explains a general process for the manufacture of multilayer printed circuit boards. One or more internal layer circuit boards 23 or 33, prepregs 22 or 32, a pair of single-sided or double-sided metal clad laminates 21a and 21b, or 31a and 31b and outside tools 24 or 34 are stacked as shown in FIG. 7(a) or 7(b), the stack is placed between two heating press plates 26 or 36 via cushion materials 25 or 35, and the stack is pressed with heating to harden the prepregs, resulting in a firmly integrated laminate which is then processed by perforation, through-hole plating, and surface etching to complete a multilayer printed circuit board.

The adhesion between the prepreg 22 and the surfaces of the resin sides of the above-mentioned single-sided metal-clad laminates or internal layer circuit boards 21a, 21b and 23 is improved by providing a roughness on the surface of the resin board.

Note, the above-mentioned single-sided or double-sided metal laminates 21a, 21b, 31a and 31b, and the internal layer circuit boards 23 and 33 are manufactured by stacking a copper foil and a prepreg, and pressing the stack with heating to harden the prepreg, resulting in adhesion between the copper foil and the resin board of the hardened prepreg. In such a process, by applying a surface roughened film or sheet to the surface of the prepreg at the side opposite to the copper foil, the single-sided copper-clad laminated having the surface roughened resin side can be obtained. The film or sheet of the present invention is preferable as the surface roughened film used in this process.

In many cases, more than one of the above-mentioned stacks consisting of the copper foil and the prepreg are stacked, and pressed with heating to manufacture more than one metal-clad laminate simultaneously. In such a case, the surface roughened film also serves as a releasing material.

EXAMPLES

The present invention will now be further illustrated by, but is by no means limited to, the following examples.

EXAMPLE 1

Referring to FIG. 3, a crystalline copolymer of 4-methyl-1-pentene, 1-hexadecene and 1-octadecene, having 95 mole percents of 4-methyl-1-pentene unit, and a melt flow rate of 26 g/10 min., was melted with a small amount of phenolic antioxidant in an extruder 9 having a diameter of 65 mm at 280° C., the molten polymer was extruded through a manifold T-die 1, and the extruded polymer was cooled by cooling rolls at 60° C. to form a film having a thickness of 50 micrometers.

The film thus prepared was then heated by heating rolls 8 at 200° C., and the heated film was passed through a pair of roughening rolls 2d and 2e to roughen the surface of the film.

Figure 4:
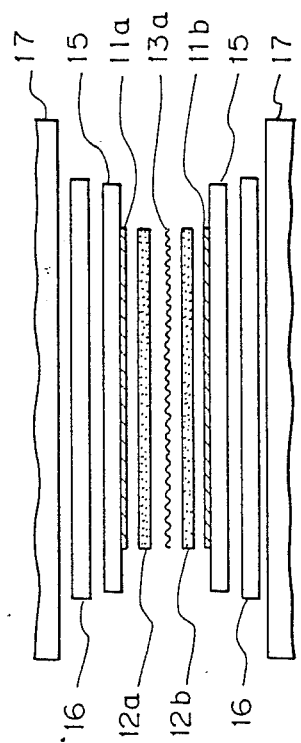
FIGS. 4 and 5 represent processes for the production of single-sided metal-clad laminate of which the resin side is surface-roughened, through using a surface-roughened film of the present invention.

As shown in FIG. 4, the surface-roughened film 13a thus prepared, glass-reinforced epoxy resin prepregs having a thickness of 500 micrometers 12a and 12b, and copper foils 11a and 11b having a thickness of 40 micrometers were stacked one upon the other. Tools 15 were applied to both sides of the stack, and the stack placed between two heating press plates 17 via cushion materials 16. The stack was preheated by the press plates 17 at 180° C., at a pressure of 5 kg/cm$^2$·G for 3 minutes, and then pressed at a pressure of 30 kg/cm²·G for another 3 minutes to harden the epoxy prepreg, and thus two single-sided metal-clad laminates were produced.

Figure 5:
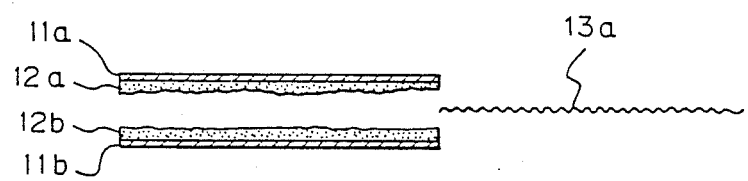
Figure 6:
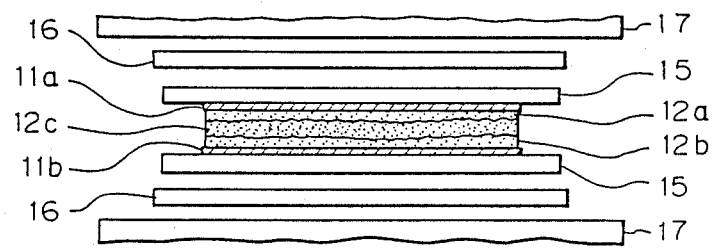
FIG. 6 represents the preparation of test laminate.

Next, as shown in FIG. 5, the single-sided metal-clad laminates 11a/12a and 11b/12b were separated from the surface roughened film 13a. As shown in FIG. 6, the single-sided metal-clad laminates 11a/12a and 12a/12b were stacked via a prepreg 12c, and the stack was placed between heating press plates via tools 15 and cushions 16, and the prepreg was hardened as described above to form a multilayer board.

Note that although the above-mentioned example represents a model for the manufacture of a multilayer board, in practice, in the manufacture of a multilayer printed circuit board as shown in FIG. 7a and 7b, one or more internal layer circuit boards are stacked between the single-sided metal-clad laminates.

The single-sided metal-clad laminate and the multilayer board prepared as above were evaluated as follows:

The peel strength (kg/15 mm) between the single-sided metal-clad laminate and the surface roughened film, and the peel strength (kg/15 mm) between the hardened epoxy resin 12a of the single-sided metal-clad laminate and the hardened resin 12c converted from the epoxy prepreg were measured by using an peeling test equipment (Instron Type Universal Tester made by Instron Company in U.S.A.) under a peeling speed of 200 mm/min.

The physical properties were evaluated as follows:
(1) Gloss: ASTM-D2457 (angle 60°)
(2) Surface roughness: Surface Figure Measuring Apparatus (K. K. Kosaka Kenkyusho)
(3) Tear strength: ASTM-D1922
The results are set forth in Table.

EXAMPLE 2

The procedure of Example 1 was repeated except that a roll with the surface roughness of 2 micrometers was used. The results are set forth in the Table.

EXAMPLE 3

The procedure of Example 1 was repeated except that a roll having a surface roughness of 7 micrometers was used. The results are set forth in the Table.

EXAMPLE 4

The procedure of the Example 1 was repeated except that the roughening roll was prepared by adhering a surface roughening film to the roll as shown in FIG. 2. The results are set forth in the Table.

EXAMPLE 5

The procedure of Example 1 was repeated except that 5.3 parts by weight of calcium carbonate was mixed with 100 parts by weight of the copolymer of 4-methyl-1-pentene. The results are set forth in the Table.

EXAMPLE 6

A film extruded from the T-die under the condition described in Example 1, but not surface-roughened, was used to prepare a multilayer printed circuit board. The results are set forth in the Table.

EXAMPLE 7

The procedure of Example 1 was repeated except that a surface-roughened film having a mean roughness of 20 micrometers was used for the roughening roll. The results are set forth in the Table.

EXAMPLE 8

The procedure of Example 1 was repeated except that 66.7 parts by weight of calcium carbonate was mixed with 100 parts by weight of the copolymer of 4-methyl-1-pentene. The results are set forth in the Table.

TABLE

|  |  | Ex. 1 | Ex. 2 | Ex. 3 | Ex. 4 | Ex. 5 | Ex. 6 | Ex. 7 | Ex. 8 |
|---|---|---|---|---|---|---|---|---|---|
| Gloss (%) | Surface-roughened film | 6 | 10 | 4 | 7 | 5 | 95 | 24 | 2 |
|  | Hardened prepreg | 7 | 13 | 5 | 8 | 6 | 90 | 27 | 3 |
| Surface roughness (micro meter) | Mean roughness | 6 | 3 | 8 | 5 | 7 | 0.1 | 25 | 8 |
|  | Difference between max. and min. | 10 | 5 | 12 | 8 | 10 | 0.3 | 50 | 10 |
| Peel strength (kg/15 mm)[1] |  | 0.05 | 0.03 | 0.06 | 0.04 | 0.1 | 0.01 | 1.1 | 1.2 |
| Elmendorf tear strength (kg/cm) | MD | 35 | 35 | 35 | 35 | 30 | 35 | 35 | 3 |
|  | TD | 80 | 80 | 80 | 80 | 75 | 80 | 80 | 5 |
| Peel strength[2] (kg/15 mm) |  | 3.5 | 2.8 | 4.0 | 3.1 | 3.8 | 0.8 | 5.5 | 4.0 |

Peel strength[1]: between a single-sided metal-clad laminate (copper foil/hardened epoxy resin) and a surface-roughened film.
Peel strength[2]: between a hardened epoxy resin layer of a single-sided metal-clad laminate and a prepreg.

As seen from the Table, in Examples 1 to 5, the peel strength between the hardened epoxy resin layer and the surface-roughened film is as low as 0.03 to 0.1 kg/15 mm, thus showing an improved release property. Also, the peel strengthen between the surface-roughened epoxy resin layer and the hardened prepreg is as high as 2.8 to 4.0 kg/15 mm, showing an improved adherence.

On the other hand, the film having a smooth surface provides a better release property but does not improve the adhesion between the hardened resin layer and the prepreg. The adhesion is as low as 0.8 kg/15 mm.

Moreover, as seen from Example 7, the film having a surface roughness as high as 25 micrometers provides a poor release property as represented by a high peer strength of 1.1 kg/15 mm; and as seen from Example 8, a film containing a too many amount of filler provides a poor release property, as represented by a high peel strength of 1.2 kg/15 cm and a low tear strength of 3 to 5 kg/cm.

Since the film and sheet of the present invention comprises a crystalline homopolymer or crystalline copolymer of 4-methyl-1-pentene, it exhibits preferable properties inherent in a polymer comprising 4-methyl-1-pentene, i.e., excellent hardness, impact resistance, and heat resistance. Moreover, since the film or sheet of the present invention do not contain a substantial amount of inorganic fillers, they are not easily torn or broken, and do not deposit impurities on their surface.

Therefore, when used for the manufacture of a single-sided metal-clad laminate as a surface-roughened film or sheet, they do not soften and deteriorate during the hardening of the prepreg, and are easily peeled from the hardened resin. Since they do not deposit impurities thereon, therefore the surface of the copper foil is free from impurities which would interfere with the etching process.

Moreover, since the film and sheet of the present invention have at least one roughened surface having a surface roughness of 0.5 to 10 micrometers, an improved release property is provided between the hardened and surface-roughened resin and the film or sheet, and improved adhesion is provided between the hardened and surface-roughened resin of the laminate and a hardened prepreg.

Therefore the present film and sheet are especially useful in the manufacture of metal-claded laminates, and therefore, of multilayer printed circuit boards.

We claim:

1. A process for production of an essentially non-oriented surface-roughened film or sheet comprising a crystalline homopolymer or crystalline copolymer of 4-methyl-1-pentene having a surface roughness of 0.5 to 10 micrometers, said process comprising the following steps:
   (1) preparing a molten composition comprising a homopolymer or copolymer of 4-methyl-1-pentene wherein the polymer comprises at least 85 molar percent of the 4-methyl-1-pentene unit;
   (2) extruding the molten composition to form a film or sheet; and
   (3) placing the film or sheet in contact with a roll having a roughened surface or passing the film or sheet through a pair of rollers, at least one of which rollers has a roughened surface wherein the surface roughness of the roughened roller is 0.5 to 10 micrometers, at a pressure and a temperature such that the roughness of the surface of the roll is replicated on the surface of the film or sheet.

2. A process for production according to claim 1 wherein the surface-roughened roller comprises a roller and a surface, roughened film or sheet adhered to the surface of the roller.

3. A process for production of a surface roughened film or sheet comprising a crystalline homopolymer or crystalline copolymer of 4-methyl-1-pentene having a surface roughness of 0.5 to 10 micrometers, comprising the following steps:
   (1) preparing a molten composition comprising a homopolymer or copolymer of 4-methyl-1-pentene wherein the polymer comprises at least 85 molar percent of the 4-methyl-1-pentene unit;
   (2) extruding the molten composition; and
   (3) placing the molten composition in contact with a roll having a roughened surface or passing the molten composition through a pair of rollers, at least one of which rollers has a roughened surface, to form a film or sheet having a roughened surface, wherein the surface roughness of the roughened roller is 0.5 to 10 micrometers at pressure and a temperature such that the roughness of the surface of the roll is replicated on the surface of the film or sheet.

4. A process for production according to claim 2 wherein the surface-roughened roller comprises a roller and a surface-roughened film or sheet adhered to the surface of the roller.

5. A method of manufacturing single-sided metal clad laminates, wherein an essentially non-oriented surface-roughened film or sheet of claim 1 is applied to a stack consisting of a prepreg and a metal foil so that the roughened surface of the surface-roughened film or sheet is in contact with a surface of the side of the prepreg opposite to the metal foil, and one or more of the stacked laminates are placed between heated press plates and pressed with heating to harden the prepreg, wherein the roughness of the surface-roughened film or sheet is replicated on the surface of the hardened prepreg.

* * * * *